United States Patent [19]

Shimizu et al.

[11] 4,258,124
[45] Mar. 24, 1981

[54] PHOTOSENSITIVE COMPOSITION

[75] Inventors: Shigeki Shimizu; Akinobu Oshima, both of Tokyo, Japan

[73] Assignee: Mitsubishi Chemical Industries Ltd., Tokyo, Japan

[21] Appl. No.: 73,289

[22] Filed: Sep. 7, 1979

[30] Foreign Application Priority Data

Sep. 14, 1978 [JP] Japan ............................... 53/112998

[51] Int. Cl.³ .............................................. G03C 1/68
[52] U.S. Cl. ................................... 430/285; 430/271; 430/275; 430/286; 204/159.19
[58] Field of Search ............... 430/285, 286, 271, 275, 430/300, 302, 306; 204/159.19

[56] References Cited

U.S. PATENT DOCUMENTS

| | | | |
|---|---|---|---|
| 3,030,208 | 4/1962 | Schellenberg et al. | 430/285 |
| 3,591,377 | 7/1971 | Alsup | 430/285 |
| 3,622,320 | 11/1971 | Allen | 430/285 |
| 3,860,426 | 1/1975 | Cunningham et al. | 430/285 |
| 3,926,642 | 12/1975 | Breslow et al. | 430/285 |

Primary Examiner—Jack P. Brammer
Attorney, Agent, or Firm—Oblon, Fisher, Spivak, McClelland & Maier

[57] ABSTRACT

A photosensitive composition comprising a polyester formed from dicarboxylic acid units of the formula:

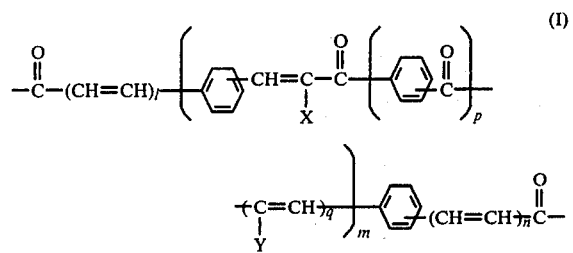

wherein l, m, n, p and q are independently an integer of 0 or 1 with at least one of l, m and n having a value of 1, X and Y are independently hydrogen or X and Y are combined to form an alkylene group containing 1-4 carbon atoms; and said polyester containing alkylene glycol units of the formula: $-O-(RO)_r$ wherein R is alkylene of 2-4 carbon atoms and r is an integer of 2-4 and said polyester also containing hydrogenated bisphenol units represented by the formula:

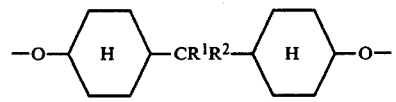

wherein $R^1$ and $R^2$ independently are hydrogen or an alkyl group of 1-6 carbon atoms.

8 Claims, No Drawings

PHOTOSENSITIVE COMPOSITION

BACKGROUND OF THE INVENTION

1. Field of the Invention

This invention relates to a photosensitive composition. More particularly, it relates to a photosensitive composition which is able to provide a printing plate excellent in chemical resistance and printing durability.

2. Description of the Prior Art

As a typical class of photosensitive polymers, there are known polymers having

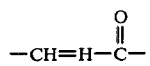

groups in the main chain thereof. The polymers of this class are prepared by condensation reaction of dicarboxylic acids such as phenylenediacrylic acid, carboxycinnamic acid and chalconedicarboxylic acid and glycols such as ethylene glycol, propylene glycol, butylene glycol, hexamethylene glycol, diethylene glycol and triethylene glycol. However, the polymers containing the glycols of the above-mentioned type show very high sensitivity but exhibit a disadvantageously low chemical resistance. The polymers are apt to be swollen with petroleum hydrocarbon solvents and are gradually worn out by a frictional force. Since petroleum hydrocarbons are usually employed as a solvent for printing ink, it is difficult to make a printing plate of excellent printing durability from these polymers.

SUMMARY OF THE INVENTION

We have made an intensive study of polymers which are improved in chemical resistance without lowering the excellent sensitivity of polymers having the

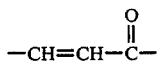

group in the main chain thereof. As a result, it has been found that the above purpose is achieved by using a hydrogenated bisphenol as a part of glycol component.

According to the invention, there is provided a photosensitive composition characterized by comprising a polyester composed of dicarboxylic acid units expressed by the general formula (I)

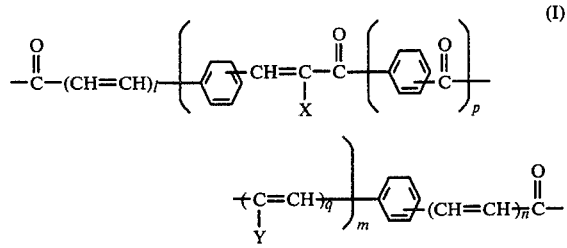

(in which l, m, n, p and q are independently an integer of 0 or 1 but at least one of l, m and n is a value of 1, and X and Y independently represent a hydrogen atom or X and Y are combined together to form an alkylene group containing 1–4 carbon atoms) and glycol units expressed by the general formula (II)

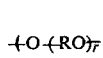

(in which R represents an alkylene group containing 2–4 carbon atoms, and r is an integer of 2–4) and by the general formula (III)

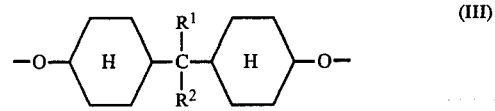

(in which

represents a hydrogenated benzene ring, and $R^1$ and $R^2$ independently represent a hydrogen atom or an alkyl group containing 1–6 carbon atoms).

DETAILED DESCRIPTION OF THE PREFERRED EMBODIMENTS

The photosensitive composition according to the invention comprises as its photosensitive component a polyester composed of the dicarboxylic acid units of the general formula (I) and the glycol units of the general formulae (II) and (III).

The dicarboxylic acid units of the general formula (I) are those derived from phenylenediacrylic acid, p-carboxycinnamic acid, bis(p-carboxybenzal)cyclohexanone, bis(p-carboxybenzal) cyclopentanone, p,p'-chalconedicarboxylic acid, bis(p-carboxycinnamoyl)benzene and the like. Of these, the units derived from phenylenediacrylic acid are most preferable.

The glycol units of the general formula (II) are those derived from diethylene glycol, triethylene glycol, tetraethylene glycol, dipropylene glycol, tripropylene glycol and the like.

The glycol units of the general formula (III) are those derived from hydrogenated bisphenol F, hydrogenated bisphenol A and the like. The degree of hydrogenation is preferred to be higher and the glycol units of the general formula (III) where

is a cyclohexane ring is most preferable.

The ratio of the glycol units of the general formula (II) to the total glycol units is generally in the range of 10–90 mole %, preferably 30–70 mole %. Larger ratio will lower the chemical resistance, while smaller ratio will lower the sensitivity.

The weight-average molecular weight of the photosensitive polyester is not critical but is generally in the range of 5000–50000, preferably 9000–20000, when applied as a printing plate.

The photosensitive polyester of this type can be readily prepared by a known procedure, for example, by a procedure as described in U.S. Pat. No. 3,622,320. That is, a dicarboxylic ester which makes the dicarboxylic acid units of the general formula (I) and a glycol mixture which makes the glycol units of the general formulae (II) and (III) are heated to dissolve, to which is added a titanium or germanium catalyst to effect the ester interchange, followed by reducing the pressure qradually and increasing the temperature to distil off an excess of the glycols thereby preparing a polyester. The reaction time is generally about 4 hours. In the final stage of the polymerization, the temperature is in the range of 230°–240° C. and the reduced pressure is about 3 mmHg.

The photosensitive composition according to the invention is usually prepared by dissolving the photosensitive polymer in solvent. Suitable solvents vary depending on the molecular weight and composition of the polymer and are usually taken from chlorine-containing compounds such as methylene chloride, chloroform, trichloroethane, trichloroethylene, chlorobenzene, carbon tetrachloride and the like; alcohol solvents such as furfurly alcohol, tetrahydrofurfuryl alcohol, benzyl alcohol and the like; ether solvents such as dioxane, tetrahydrofuran and the like; ethylene glycol monoalkyl ether and diethylene glycol monoalkyl ether solvents such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl glycol, diethylene glycol monobutyl ether and the like; ester solvents such as ethylene glycol ethyl ether acetate, diethylene glycol ethyl ether acetate, ethyl acetate and the like, nitrogen-containing compounds such as dimethylformamide, methylpyrrolidone, nitroethane, nitrobenzene and the like; ketone solvents such as methyl ethyl ketone, methyl isobutyl ketone, cyclohexanone, methylcyclohexanone, 4-methyl-4-methoxy-2-pentanone and the like; and dimethylsulfoxide.

The photosensitive composition according to the invention may further comprise various other components, if necessary, including, for example, a sensitizer or a pigment such as phthalocyanine or zinc oxide.

Any of the sensitizers usually employed in this field are usable including, for example, aromatic carbonyl compounds such as benzophenone derivatives, benzanthrone derivatives, naphothiazoline derivatives, quinones and the like, or aromatic nitro compounds.

Examples of the benzophenone derivatives are Michler's ketone, diethylaminoethylbenzophenone and the like; examples of the benzanthrone derivatives are benzanthrone, 6,11-dichlorobenzanthrone, 11-chloro-6-hydroxybenzanthrone, 1-carboethoxy-2-keto-3-methyl-3-aza-1, 9-benzanthrone and the like; examples of the quinones are 1,8-dimethoxyanthraquinone, 1,8-dichloroanthraquinone, 1,2-benzanthraquinone and the like; examples of the aromatic nitro compounds are mono or polynitro compounds such as 5-nitroacenaphthene, 2-nitrofluorene, 2,7-dinitrofluorene, 1-nitronaphthalene, 1,5-dinitronaphthalene, and the like; and examples of naphthothiazoline are 2-dibenzoylmethylene-3-methylnaphthothiazoline, 2-benzoylmethylene-3-methylnaphthothiazoline and the like.

The photosensitive composition according to the invention is applicable by a usual manner onto a support such as a polymer film or a metal sheet such as a polyethylene terephthalate film, a printing zinc plate, a printing aluminium plate, a silicon wafer, a chromium plate or the like by any of known application techniques such as a dip coating, a rod coating, a spinner coating and a spray coating thereby obtaining a photosensitive sheet.

Any desired image can be formed on a photosensitive sheet by superposing an object to be copied on the sheet and exposing it to light or by irradiating the sheet with an electronic beam to write an image thereon, followed by developing the formed image.

The photosensitive composition of the invention which has been described in detail hereinabove comprises the photosensitive polymer which shows very high sensitivity and excellent chemical resistance. Accordingly, such photosensitive composition is usable to make a printing plate and the obtained printing plate is excellent in printing durability.

The present invention will be further illustrated by way of the following examples, which should not be construed as limiting the invention thereto.

EXAMPLE 1

2.74 g (0.01 mole) of phenylenediethylacrylate, 1.20 g (0.005 moles) of hydrogenated bisphenol A (produced by Shin Nippon Physical and Chemical Ind. Co., Ltd., aromatic component content of below 0.2%) and 1.13 g (0.007 moles) of triethylene glycol were charged into a glass polymerization tube and dissolved on a bath of 150° C. Two drops of isopropyl titanate was added as a catalyst, after which the bath temperature was raised up to 210° C. in about 2 hours while feeding argon gas into the polymerization tube thereby completely distilling off the resulting ethanol. Then, the bath temperature was increased up to 235° C. under a reduced pressure of 3 mmHg in about 1.5 hours to effect the condensation reaction while distilling off an excess of the triethylene glycol. After cooling, the glass tube was broken to obtain 3.3 g of a transparent photosensitive polyester (A) having a weight-average molecular weight of 19000 (hydrogenated bisphenol A/triethylene glycol (molar ratio)=1).

The above process was repeated using 2.74 g of phenylenediethylacrylate and 2.90 g of hydrogenated bisphenol A thereby obtaining 3.5 g of a photosensitive polyester (B) having a weight-average molecular weight of 16000.

The respective photosensitive polyesters were used to prepare 4% chlorobenzene solutions, to which was added 2-dibenzoylmethylene-3-methyl-$\beta$-naphthothiazoline (hereinlater abbreviated as DBT) in an amount of 5% based on the polyester to give photosensitive solutions. Each solution was applied onto a quartz plate by means of a spinner. Each photosensitive plate was exposed by the use of a high pressure mercury lamp (3.0 KW) at distance, 75 cm, from the plate for 40 seconds and a reactivity of the unsaturated bonds in the polyester was measured by the use of an UV spectrum. As a result, it was found that the reactivity for the polyester (A) was 64% and that for the polyester (B) was 23%.

Then, to the cyclohexanone solution of 4% photosensitive polyester (A) were added DBT in an amount of 5% of the polyester and a phthalocyanine pigment in an amount of 20% of the polyester to give a photosensitive solution. The solution was applied onto a sand-blasted Al plate with use of a whirler.

The thus obtained photosensitive plate was exposed through a step wedge with a step difference of 0.15 by the use of a 3 KW high pressure mercury lamp at a distance, 75 cm, from the plate for 20 seconds. This plate was developed with a $\gamma$-butyrolactone-phosphoric acid mixed solution. As a result, it was found that the photosensitive layer was insolubilized to an extent of 10 steps.

Further, to the chlorobenzene solution of 4% photosensitive polyester (A) were added DBT in an amount of 5% of the polyester and a phthalocyanine pigment in an amount of 20% of the polyester to give a photosensitive solution. This solution was applied onto a sandblasted Al plate by means of a whirler. The resulting photosensitive plate was brought to intimate contact with a negative image and exposed by means of a 3 KW high pressure mercury lamp at a distance, 75 cm, from the plate for 30 seconds, followed by developing with a γ-butyrolactone-phosphoric acid mixed solution. The resulting image was subjected to a chemical resistance test using a petroleum solvent, revealing that no change was recognized in reflection density of the image before and after the test.

EXAMPLE 2

2.74 g (0.01 mole) of phenylenediethylacrylate, 1.20 g (0.005 moles) of hydrogenated bisphenol A and 0.75 g (0.007 moles) of diethylene glycol were used to effect the condensation in the same manner as in Example 1 to obtain a photosensitive polyester (C) having a weight-average molecular weight of 18000 (hydrogenated bisphenol A/diethylene glycol (molar ratio)=1).

This photosensitive polyester (C) was tested similarly to the case of Example 1 and, as a result, similar results were obtained.

EXAMPLE 3

2.74 g (0.01 mole) of phenylenediethylacrylate, 0.84 g (0.0035 mole) of hydrogenated bisphenol A and 1.37 g (0.0085 mole) of triethylene glycol were charged into a glass polymerization tube to effect the condensation reaction while distilling off an excess of the triethylene glycol in the same manner as in Example 1. As a result, 3.3 g of photosensitive polyester (D) having a weight average molecular weight of 16,000 (hydrogenated bisphenol A/triethylene glycol (mole ratio)=3.5/6.5) was obtained.

This photosensitive polymer (D) was tested similarly to the case of Example 1. As a result, it was found that the photosensitive layer was insolubilized to an extent of 10 steps and it was revealed that reflection density of the image was 93% of that before the test.

What is claimed as new and intended to be secured by Letters Patent of the United States is:

1. A photosensitive composition, which comprises: a polyester having dicarboxylic acid units represented by formula (I):

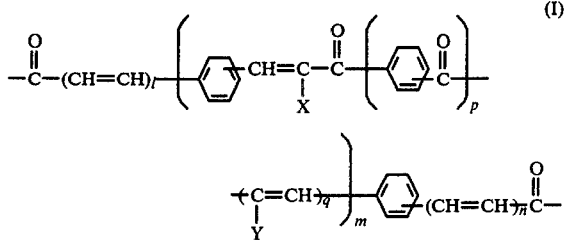

wherein l, m, n, p and q are independently an integer of 0 or 1 but at least one of l, m and n is a value of 1, X and Y are independently hydrogen or X and Y are combined to form an alkylene group containing 1-4 carbon atoms; and said polyester having alkylene glycol units represented by formula (II)

 (II)

wherein R represents an alkylene group containing 2-4 carbon atoms and r is an integer of 2-4 and said polyester also having hydrogenated bisphenol units represented by formula (III):

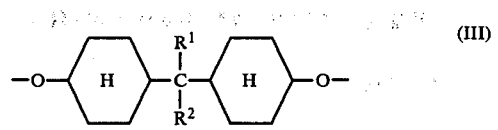 (III)

wherein the amount of said hydrogenated bisphenol is sufficient to improve the chemical resistance of the polymer without diminishing its photosensitivity, and wherein

represents a hydrogenated benzene ring, and $R^1$ and $R^2$ independently represent a hydrogen or an alkyl group containing 1-6 carbon atoms.

2. The photosensitive composition according to claim 1, wherein the weight-average molecular weight of the polyester is in the range of 5000–50000.

3. The photosensitive composition according to claim 2, wherein said composition comprises a solvent.

4. The photosensitive composition according to claim 3, wherein said composition comprises a sensitizer.

5. The photosensitive composition according to claim 1, wherein the dicarboxylic acid units are those expressed by the formula (IV):

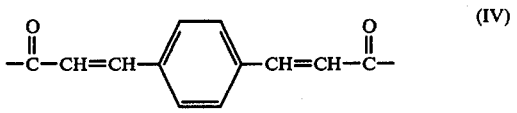 (IV)

6. The photosensitive composition according to claim 1, wherein the ratio of the glycol units of formula (II) to the total glycol units is in the range of 10–90 mole %.

7. The photosensitive composition according to claim 1, wherein the hydrogenated benzene ring contained in the glycol units of formula (III) is a cyclohexane ring.

8. A photosensitive plate comprising a support having coated thereon a layer of a photosensitive composition comprising a polyester having dicarboxylic acid units represented by the formula (I)

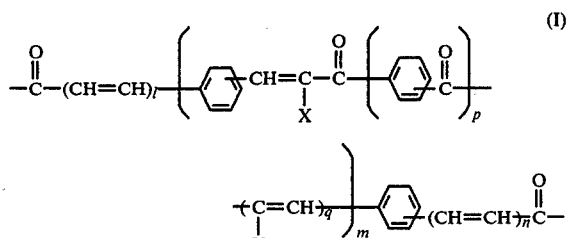 (I)

wherein l, m, n, p and q are independently an integer of 0 or 1 but at least one of l, m and n is a value of 1, X and Y are independently a hydrogen atom or X and Y are combined to form an alkylene group containing 1–4 carbon atoms; and said polyester having alkylene glycol units represented by the formula (II):

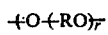 (II)

wherein R represents an alkylene group containing 2–4 carbon atoms and r is an integer of 2–4, and said polyester also having hydrogenated bisphenol units represented by the formula (III):

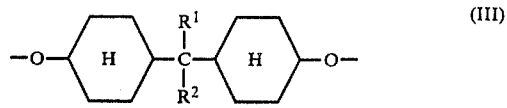

wherein the amount of said hydrogenated bisphenol present is sufficient to improve the chemical resistance of the polymer without diminishing the photosensitivity, and
wherein

represents a hydrogenated benzene ring, and $R^1$ and $R^2$ independently represent a hydrogen or an alkyl group containing 1–6 carbon atoms.

* * * * *